United States Patent
Brabec et al.

(10) Patent No.: US 7,612,367 B2
(45) Date of Patent: Nov. 3, 2009

(54) PHOTOVOLTAIC COMPONENT AND PRODUCTION METHOD THEREFOR

(75) Inventors: Christoph Brabec, Linz (AT); Christoph Waldauf, Innsbruck (AT)

(73) Assignee: Konarka Technologies, Inc., Lowell, MA (US)

( * ) Notice: Subject to any disclaimer, the term of this patent is extended or adjusted under 35 U.S.C. 154(b) by 0 days.

(21) Appl. No.: 10/536,568

(22) PCT Filed: Nov. 21, 2003

(86) PCT No.: PCT/EP03/13095

§ 371 (c)(1),
(2), (4) Date: Oct. 24, 2005

(87) PCT Pub. No.: WO2004/051756

PCT Pub. Date: Jun. 17, 2004

(65) Prior Publication Data

US 2006/0141662 A1   Jun. 29, 2006

(30) Foreign Application Priority Data

Nov. 29, 2002   (DE) ................................ 102 55 964

(51) Int. Cl.
*H01L 35/24* (2006.01)
*H01L 51/00* (2006.01)

(52) U.S. Cl. ............ 257/40; 257/E39.007; 257/E51.01; 257/E51.012

(58) Field of Classification Search ................... 257/40, 257/E39.007, E51.012, E29.16, E51.01
See application file for complete search history.

(56) References Cited

U.S. PATENT DOCUMENTS

| 4,401,545 | A | | 8/1983 | Naarmann et al. |
| 4,520,086 | A | | 5/1985 | Skotheim et al. |
| 4,758,526 | A | * | 7/1988 | Thalheimer .................. 438/80 |
| 5,389,159 | A | * | 2/1995 | Kataoka et al. ............. 136/251 |
| 5,454,880 | A | * | 10/1995 | Sariciftci et al. ............ 136/263 |
| 5,470,505 | A | | 11/1995 | Smith et al. |
| 5,681,402 | A | | 10/1997 | Ichinose et al. |
| 6,083,635 | A | | 7/2000 | Jonas et al. |
| 6,451,415 | B1 | | 9/2002 | Forrest et al. |
| 6,472,594 | B1 | * | 10/2002 | Ichinose et al. ............. 136/256 |
| 6,483,099 | B1 | * | 11/2002 | Yu et al. ................... 250/214.1 |
| 6,498,049 | B1 | * | 12/2002 | Friend et al. .................. 438/34 |

(Continued)

FOREIGN PATENT DOCUMENTS

CN          1131824 A          9/1996

(Continued)

OTHER PUBLICATIONS

Saito et al., "Deposition of organic electrodes based on wet process for organic devices" *Applied Physics Letter* vol. 80:1489-1491 (2001).

(Continued)

*Primary Examiner*—Wael Fahmy
*Assistant Examiner*—John C Ingham
(74) *Attorney, Agent, or Firm*—Fish & Richardson P.C.

(57) ABSTRACT

The invention relates to an organic component comprising an improved top electrode and to a production method therefor. The top electrode is made of an organic material that is applied by means of printing techniques.

36 Claims, 1 Drawing Sheet

U.S. PATENT DOCUMENTS

| | | | |
|---|---|---|---|
| 6,545,290 B2 * | 4/2003 | Lorin et al. | 257/40 |
| 6,692,820 B2 * | 2/2004 | Forrest et al. | 428/212 |
| 6,746,751 B2 * | 6/2004 | Lamotte et al. | 428/141 |
| 2003/0099845 A1 | 5/2003 | Ogawa et al. | |

FOREIGN PATENT DOCUMENTS

| | | |
|---|---|---|
| CN | 1270706 A | 10/2000 |
| DE | 10024933 | 11/2001 |
| DE | 10024993 | 11/2001 |
| DE | 10024993 A1 | 11/2001 |
| EP | 1096577 | 5/2001 |
| EP | 1096577 A | 5/2001 |
| JP | 58021876 A | 2/1983 |
| WO | 94/05045 | 3/1994 |
| WO | WO 99/09603 | 2/1999 |
| WO | WO 01/39276 | 5/2001 |

OTHER PUBLICATIONS

White, M.S., "Inverted bulk-heterojunction organic photovoltaic device using a solution-derived ZnO underlayer" 2006, Applied Physics Letters 89, American Institute of Physics, pp. 89-91.

Coakley, Kevin M., "Photovoltaic cells made from conjugated polymers infiltrated into mesopoerous titania" Oct. 2003, Applied Physics Letters, vol. 83, No. 16, American Institute of Physics, pp. 3380-3382.

Shaheen, Sean E., "Inverted bulk-heterojunction plastic solar cells", 2007, SPIE, 3 pages.

Lee, Tae-Wood, "Organic Light-Emitting Diodes Formed by Soft Contact Lamination", Jan. 13, 2004, National Academy of Sciences, pp. 429-433.

Li, Gang, "High-efficiency solution processable polymer photovoltaic cells by self-organization of polymer blends", Nov. 2005, Nature Publishing Group, pp. 864-868.

Padinger, Franz, "Effects of Postproduction Treatment on Plastic Solar Cells", Jan. 2003, Advanced Functional Materials, Wiley-VCH, pp. 85-88.

Shaheen, Sean, "Organic-Based Photovoltaics: Toward Low-Cost Power Generation", Jan. 2005, Mrs Bulletin, vol. 30, pp. 10-19.

* cited by examiner

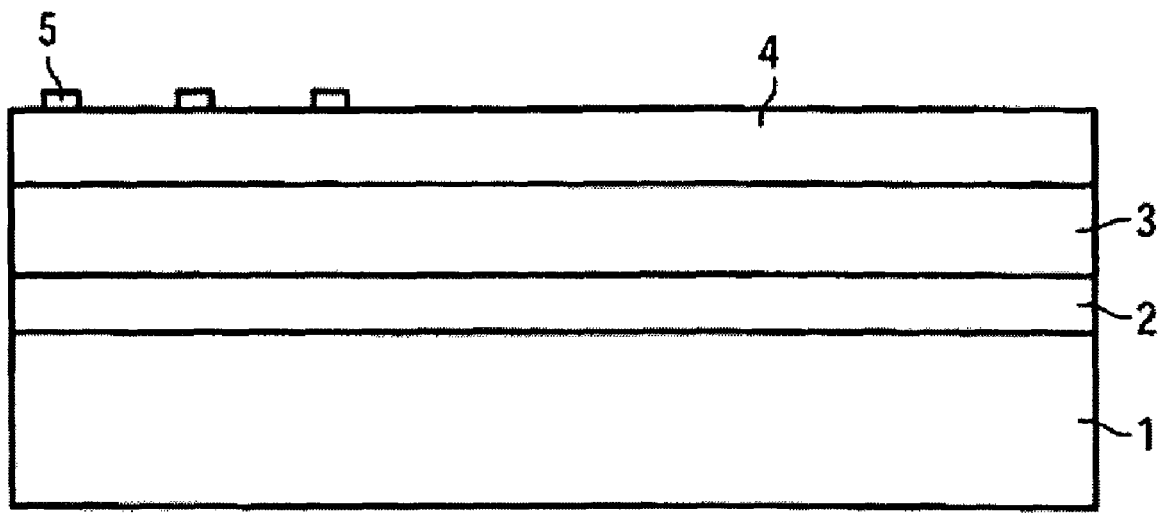

PHOTOVOLTAIC COMPONENT AND PRODUCTION METHOD THEREFOR

This application is national phase filing under 35U.S.C. § 371 of international application number PCT/EP2003/013095, filed 21 Nov. 2003, which claims priority to German application number 102 55 964.3, filed 29 Nov. 2002. These applications are incorporated by reference herein.

The invention concerns an organic component comprising an improved top electrode and a production method therefor.

Photovoltaic elements typically having the following cell structure are known for example from 2002P14485DE:

Disposed on a substrate is a positive electrode (typically ITO, indium tin oxide). Disposed thereon, as an intermediate layer where appropriate, is a hole-conducting layer, made, for example, of PEDOT with PSS as the anion. The adjoining layer is an absorber, i.e., a photovoltaically active material, usually an organic semiconductor (e.g. a mixture of conjugated polymer with fullerene). This is followed by the negative electrode, the cathode (for example Ca/Ag or LiF/Al). Used as cathode materials heretofore have been non-noble metals such as calcium, barium, lithium fluoride, or similar materials having a low work function. These electrodes are produced by vapor-deposition or sputtering. However, the sensitivity of these cathode materials demands that, for best results, layers made from them must be produced in a vacuum.

The use of a vacuum-applied top electrode as the cathode is usually undesirable for several reasons, for one thing because a vapor-deposition process step conducted in a vacuum is cost-intensive, and for another because from a production engineering standpoint it is slow and maintenance-intensive.

The object of the invention is, therefore, to make available an organic photovoltaic component that includes at least a substrate with a bottom electrode, a functional layer and a top electrode and that can be produced without a vacuum production step.

The invention is directed to a photovoltaic component comprising a top electrode made of predominantly organic material. The invention is further directed to a method for producing a photovoltaic component, wherein applied to a substrate is a bottom conductive functional layer (electrode), thereon a semiconductive, photovoltaically active functional layer, and finally a top organic conductive functional layer is applied to the semiconductive, photoactive functional layer [syntax sic].

The term "photovoltaic component" denotes any component having a semiconductive, photoactive functional layer and a bottom electrode made of organic or inorganic material; a semiconductive, photovoltaically active functional layer; and a top conductive functional layer (electrode) made of predominantly organic material.

In one embodiment, the top electrode is formed of semitransparent material and the substrate thus no longer need exhibit any transparency, since the photons strike the semiconductive, photovoltaically active functional layer through the semitransparent top electrode. In this case, the expensive material ITO, which has heretofore been used primarily as a substrate and/or bottom electrode because of its electrical properties and transparency, can be replaced by a cheaper material such as, for example, Al, Ti, Cu or other metal sheets or foils.

In one embodiment, an inverted structure is created, i.e., replacing the known top cathodic electrode made of non-noble metal with an organic conductive material (which in this case is not semitransparent, but opaque) reverses the direction of current, so that here, in the case of an ITO (indium tin oxide) layer as the bottom electrode and/or the substrate, the top electrode is the positive electrode and the negative electrode is on the substrate side.

In one embodiment, the organic photovoltaic element is constructed with the following organic materials:

Applied to a substrate composed of ITO is a semiconductive layer, for example a P3HT:PCBM (poly(3-hexylthiophene):[6,6]-phenyl $C_6$, butyric acid methyl ester) mixture (low bandgap), which forms the photovoltaically active functionally layer. This is followed by an organic conductive functional layer, for example of PEDOT.

The term "organic material" and/or "functional polymer" herein encompasses all types of organic, metalorganic and/or inorganic synthetic materials, which are denoted in English, for example, by the term "plastics." This includes all types of materials except for semiconductors used for conventional diodes (germanium, silicon) and typical metallic conductors. Thus, no limitation is intended in the dogmatic sense to organic material as carbon-containing material, but rather, the widespread use of, for example, silicones is also contemplated. Furthermore, the term is not intended to imply any limitation with respect to molecular size, particularly to polymeric and/or oligomeric materials, but rather, the use of "small molecules" is also by all means possible.

In one embodiment of the method, the organic electronic photovoltaically active element can be produced by the following process steps:

First, a semitransparent substrate, for example an ITO substrate, is coated with the semiconductive organic material. The coating is preferably done by techniques suitable for mass production, such as printing, spin coating or the like. The top electrode layer, preferably made of conductive organic material, is also preferably applied to the semiconductive functional layer by means of printing techniques.

In one embodiment, the production of the top electrode layer is followed by the imprinting of leakage connectors, for example of silver conductive paste, to reduce ohmic losses. Alternatively, carbon screen-printing pastes, for example, can be used, but it is also conceivable to produce the conduction paths by low-cost metallization, such as sputtering or vapor deposition.

The term "organic electronic photovoltaically active component" herein denotes, for example, a solar cell, a photodetector, or any other type of electronic module that has a photovoltaically active functional layer as its essential element.

The invention is described in more detail hereinbelow with reference to an exemplary figure that shows a schematic rendering of an organic photovoltaically active element.

Applied to the substrate 1, which can be made, for example, of thin foil or thin (ultra-thin) glass, is the bottom electrode 2, which can for example be made semitransparent, from ITO, or non-transparent, from metals such as aluminum, chromium, molybdenum, copper and/or zinc. Applied to this bottom electrode 2 is the semiconductive layer 3, which is photovoltaically active, can be formed of organic or, alternatively, metallic or hybrid material, and preferably has good solvent processability. This layer is followed by the top conductive functional layer or top electrode 4, which can be implemented as semitransparent or as fully absorptive.

A suitable photoactive layer is known, inter alia, from U.S. Pat. No. 5,454,880 and U.S. Pat. No. 5,333,183, and can include one or more semiconductive synthetic materials, which can be present in monomeric, oligomeric and/or polymeric form, as well as inorganic particles and/or nanoparticles. A mixture of two or more conjugated organic synthetic materials, inorganic particles and/or nanoparticles having similar or different electron affinities and/or similar or different bandgaps can be present.

Thin layers of organic molecules, oligomers and molecular mixtures can be produced, for example, by thermal vapor deposition or chemical/physical vapor deposition (CVD).

Thin layers of conjugated polymers and mixtures containing conjugated polymers can be produced by spin-coating, but also by other common printing methods such as, for example, screen-printing, inkjet printing, flexo printing, gravure printing, letterpress printing or planographic printing (or other/similar solvent deposition processes). If polymers are used, these layers can also be deposited on flexible substrates.

Examples of typical semiconductive conjugated polymers include polyacetylene (PA) and derivatives thereof, polyisothianaphthene (PITN) and derivatives thereof, polythiophene (PT) and derivatives thereof, polypyrrol (PPr) and derivatives thereof, poly(2,5-thienylene vinylene) (PTV) and derivatives thereof, polyfluorene (PF) and derivatives thereof, poly(p-phenylene) (PPP) and derivatives thereof, poly(phenylene vinylene) (PPV) and derivatives thereof, as well as polyquinoline and derivatives thereof, polycarbazole and derivatives thereof, [and] semiconducting polyaniline (leucoemeraldine and/or leucoemeraldine base).

Examples of acceptors in donor/acceptor polymer mixtures include but are not limited to poly(cyanophenylenevinylene), fullerenes such as C60 and its functional derivatives (such as PCBM, PCBR) and organic molecules, organometallic molecules or inorganic nanoparticles (such as, for example, CdTe, CdSe, CdS, CIS).

In addition, any solar cells that are used can also be constructed in two separate layers in which the donor is spatially separated from the acceptor (e.g., PT/C60 or PPV/C60).

The invention concerns an organic component comprising an improved top electrode and a production method therefor. The top electrode is made of organic material that is preferably, but not necessarily, applied by means of printing techniques. The organic material makes it possible in one case to fashion the upper electrode as semitransparent and thereby use an inexpensive non-transparent electrode instead of ITO as the bottom electrode, and in the other case, where the top electrode is non-transparent and opaque and the bottom electrode is semitransparent and made of ITO, to create a photovoltaic component with an inverted structure and reverse current flow, since the top electrode then becomes the positive electrode.

The invention claimed is:

1. A cell, comprising:
   a substrate,
   first electrode,
   a photovoltaically active layer comprising an organic material, and
   a second electrode made of a predominantly organic material,
   wherein:
     the first electrode is between the substrate and the photovoltaically active layer and has a first work function,
     the photovoltaically active layer is between the first and second electrodes,
     the second electrode is opaque and has a second work function higher than the first work function, and
     the cell is a photovoltaic cell.

2. The cell as described in claim 1, wherein the second electrode is a positive electrode.

3. The cell of claim 1, further comprising leakage connectors configured to reduce ohmic losses during use of the cell.

4. The cell as described in claim 3, wherein the leakage connectors are made of silver conductive paste.

5. The cell of claim 3, wherein the leakage connectors consist of silver.

6. The cell of claim 5, wherein the leakage connectors are printed on the second electrode.

7. The cell of claim 3, wherein the leakage connectors are devoid of adhesive.

8. The cell of claim 7, wherein the leakage connectors are printed on the second electrode.

9. The cell of claim 3, wherein the leakage connectors are printed on the second electrode.

10. The cell of claim 1, wherein the second electrode comprises PEDOT.

11. The cell of claim 1, wherein the first electrode is semitransparent.

12. The cell of claim 11, wherein the second electrode is a positive electrode.

13. The cell of claim 1, wherein the second electrode covers the entire area of the photovoltaically active layer.

14. A method for producing a photovoltaic component, wherein applied to a substrate is a first electrode having a first work function, thereon a semiconductive, photovoltaically active functional layer comprising an organic material, a second electrode comprising a predominantly organic material is applied to the semiconductive, photoactive functional layer to provide the photovoltaic component, wherein
   the second electrode is opaque and has a second work function higher than the first work function.

15. The method as described in claim 14, wherein the second electrode is applied by a printing technique.

16. The method of claim 14, wherein the photovoltaic component further comprises leakage connectors configured to reduce ohmic losses during use of the photovoltaic component.

17. The method of claim 16, wherein the leakage connectors consist of silver.

18. The method of claim 17, wherein the leakage connectors are printed on the second electrode.

19. The method of claim 16, wherein the leakage connectors are devoid of adhesive.

20. The method of claim 19, wherein the leakage connectors are printed on the second electrode.

21. The method of claim 16, wherein the leakage connectors are printed on the second electrode.

22. The method of claim 14, wherein the second electrode comprises PEDOT.

23. The method of claim 14, wherein the first electrode is semitransparent.

24. The method of claim 23, wherein the second electrode is a positive electrode.

25. The method of claim 14, wherein the second electrode is a positive electrode.

26. A component, comprising:
   a substrate;
   a first electrode that is semitransparent; a second electrode comprising a predominantly organic material, the organic material comprising PEDOT; and
   a photovoltaically active layer between the first and second electrodes, the photovoltaically active layer comprising an organic material
   wherein the first electrode is between the substrate and the photovoltaically active layer and has a first work function, the second electrode is opaque and has a second work function higher than the first work function, the component is a photovoltaic component.

27. The component of claim 26, further comprising leakage connectors configured to reduce ohmic losses during use of the component.

28. The component of claim 27, wherein the leakage connectors comprise silver conductive paste.

29. The component of claim 27, wherein the leakage connectors consist of silver.

30. The component of claim 29, wherein the leakage connectors are printed on the second electrode.

31. The component of claim 27, wherein the leakage connectors are devoid of adhesive.

32. The component of claim 31, wherein the leakage connectors are printed on the second electrode.

33. The component of claim 27, wherein the leakage connectors are printed on the second electrode.

34. An article, comprising:

a substrate, a first electrode, a photovoltaically active layer comprising an organic material, and a second electrode made of a predominantly organic material, wherein:

the first electrode is between the substrate and the photovoltaically active layer and has a first work function, the photovoltaically active layer is between the first and second electrodes, the second electrode is opaque and covers the entire area of the photovoltaically active layer, the second electrode having a second work function higher than the first work function, and the article is a photovoltaic cell.

35. The article of claim 34, wherein the second electrode is a positive electrode.

36. article of claim 34, wherein the first electrode is semitransparent.

* * * * *

UNITED STATES PATENT AND TRADEMARK OFFICE
CERTIFICATE OF CORRECTION

PATENT NO. : 7,612,367 B2
APPLICATION NO. : 10/536568
DATED : November 3, 2009
INVENTOR(S) : Christoph Brabec Page 1 of 1

It is certified that error appears in the above-identified patent and that said Letters Patent is hereby corrected as shown below:

Column 3,
Line 51, delete "first" and insert --a first--.

Signed and Sealed this

Twenty-second Day of December, 2009

David J. Kappos
*Director of the United States Patent and Trademark Office*